US008642187B2

(12) United States Patent
Ohmi et al.

(10) Patent No.: US 8,642,187 B2
(45) Date of Patent: Feb. 4, 2014

(54) STRUCTURAL MEMBER TO BE USED IN APPARATUS FOR MANUFACTURING SEMICONDUCTOR OR FLAT DISPLAY, AND METHOD FOR PRODUCING THE SAME

(75) Inventors: Tadahiro Ohmi, Miyagi (JP); Minoru Tahara, Miyagi (JP); Yasuhiro Kawase, Fukuoka (JP)

(73) Assignees: National University Corporation Tohoku University, Sendai-shi (JP); Mitsubishi Chemical Corporation, Tokyo (JP)

( * ) Notice: Subject to any disclaimer, the term of this patent is extended or adjusted under 35 U.S.C. 154(b) by 538 days.

(21) Appl. No.: 12/521,387

(22) PCT Filed: Dec. 21, 2007

(86) PCT No.: PCT/JP2007/074636
§ 371 (c)(1),
(2), (4) Date: Jun. 26, 2009

(87) PCT Pub. No.: WO2008/081748
PCT Pub. Date: Jul. 10, 2008

(65) Prior Publication Data
US 2010/0330390 A1  Dec. 30, 2010

(30) Foreign Application Priority Data
Dec. 28, 2006  (JP) ................. 2006-355642

(51) Int. Cl.
B32B 15/00 (2006.01)
B32B 15/01 (2006.01)
B32B 15/04 (2006.01)
B32B 15/10 (2006.01)
B32B 9/00 (2006.01)
B32B 19/00 (2006.01)

(52) U.S. Cl.
USPC ........ 428/654; 428/615; 428/650; 428/693.1; 428/689; 428/701; 428/702

(58) Field of Classification Search
USPC .............. 428/472.2, 701, 615, 650, 654, 689, 428/693.1, 702; 205/190; 148/518
See application file for complete search history.

(56) References Cited

U.S. PATENT DOCUMENTS 4,430,387 A * 2/1984 Nakagawa et al. ............ 428/579
5,580,800 A * 12/1996 Zhang et al. ................... 438/585

(Continued)

FOREIGN PATENT DOCUMENTS

JP  58-217697 A  12/1983
JP  62-24852 A   2/1987

(Continued)

OTHER PUBLICATIONS http://www.efunda.com/materials/alloys/aluminum/show_aluminum.cfm?ID=AA_1199&show_prop=all&Page_Title=AA%201199.*

(Continued)

*Primary Examiner* — Jonathan Langman
(74) *Attorney, Agent, or Firm* — Oblon, Spivak, McClelland, Maier & Neustadt, L.L.P.

(57) ABSTRACT

A structural member for a manufacturing apparatus has a metal base member mainly composed of aluminum, a high-purity aluminum film formed on the surface of the metal base member, and a nonporous amorphous aluminum oxide passivation film which is formed by anodizing the high-purity aluminum film. A method for producing a structural member for a manufacturing apparatus, includes forming a high-purity aluminum film on the surface of a metal base member mainly composed of aluminum, and anodizing the high-purity aluminum film in a chemical conversion liquid having a pH of 4-10 and containing a nonaqueous solvent, which has a dielectric constant lower than that of water and dissolves water, thereby converting at least a surface portion of the high-purity aluminum film into a nonporous amorphous aluminum oxide passivation film.

8 Claims, 6 Drawing Sheets

(56) References Cited

U.S. PATENT DOCUMENTS

| | | | |
|---|---|---|---|
| 5,641,375 A * | 6/1997 | Nitescu et al. | 156/345.1 |
| 5,723,221 A * | 3/1998 | Brooker et al. | 428/469 |
| 6,371,841 B1 * | 4/2002 | Ray | 451/523 |
| 6,972,263 B2 * | 12/2005 | Yamazaki et al. | 438/713 |
| 6,982,121 B2 * | 1/2006 | Hasuo et al. | 428/650 |
| 8,206,833 B2 * | 6/2012 | Ohmi et al. | 428/469 |
| 2003/0150530 A1 | 8/2003 | Lin et al. | |
| 2005/0277233 A1* | 12/2005 | Ohtani et al. | 438/149 |
| 2007/0204147 A1* | 8/2007 | Kobayashi et al. | 713/155 |
| 2008/0164151 A1 | 7/2008 | Ohmi et al. | |

FOREIGN PATENT DOCUMENTS

| | | | | |
|---|---|---|---|---|
| JP | 62-267482 | | 11/1987 | |
| JP | 5 114582 | | 5/1993 | |
| JP | 5 53870 | | 8/1993 | |
| JP | 9 69514 | | 3/1997 | |
| JP | 10 130884 | | 5/1998 | |
| JP | 11 181595 | | 7/1999 | |
| JP | 2000-150718 A | | 5/2000 | |
| JP | 2004 99972 | | 4/2004 | |
| JP | 2005 60044 | | 3/2005 | |
| JP | 2005 105300 | | 4/2005 | |
| JP | 2005 524770 | | 8/2005 | |
| JP | 2006 128370 | | 5/2006 | |
| WO | WO2006/046531 | * | 5/2006 | H01L 21/316 |
| WO | WO2006046531 | * | 5/2006 | H01L 21/316 |
| WO | 2006 134737 | | 12/2006 | |

OTHER PUBLICATIONS http://www.alcoa.com/adip/catalog/pdf/Extruded__Alloy__6061.pdf.*
Japanese Office Action issued Dec. 12, 2012 in Patent Application No. 2008-552097 with English Translation of Relevant Part of Japanese Office Action.

* cited by examiner

STRUCTURAL MEMBER TO BE USED IN APPARATUS FOR MANUFACTURING SEMICONDUCTOR OR FLAT DISPLAY, AND METHOD FOR PRODUCING THE SAME

TECHNICAL FIELD

This invention relates to a structural member for use in a manufacturing apparatus and, in particular, relates to a structural member for use in an apparatus for manufacturing a semiconductor or a flat panel display and to a manufacturing method thereof.

BACKGROUND ART

As manufacturing apparatuses for use in the fields of manufacturing electronic devices such as semiconductors and flat panel displays, and so on, there are, for example, vacuum thin-film forming apparatuses for use in chemical vapor deposition (CVD), physical vapor deposition (PVD), vacuum evaporation, sputtering, microwave-excited plasma CVD, and so on, dry etching apparatuses for use in plasma etching, reactive ion etching (RIE), recently-developed microwave-excited plasma etching, and so on (hereinafter collectively referred to as vacuum apparatuses), cleaning apparatuses, sintering apparatuses, heating apparatuses, and so on. In recent years, as structural materials of these apparatuses, particularly having surfaces brought into contact with corrosive fluids, radicals, or irradiated ions, lightweight and strong metals composed mainly of aluminum have been widely used instead of stainless materials. In order to realize future efficient multi-kind small-quantity production, these apparatuses are required to shift to a three-dimensional cluster tool capable of carrying out a plurality of processes alone, to carry out a plurality of processes by switching the kind of gas in a single process chamber, or the like. Among practical metals, aluminum belongs to a particularly base group and, therefore, aluminum or a metal composed mainly of aluminum requires a protective film formed by an appropriate surface treatment.

As a surface protective film when a metal composed mainly of aluminum is used as a structural material, there is conventionally known an anodized film (alumite) obtained by anodic oxidation in an electrolyte solution. If use is made as the electrolyte solution of an acidic electrolyte solution (normally pH 2 or less), it is possible to form a smooth and uniform alumite coating film having a porous structure.

Further, the alumite coating film is corrosion-resistant and the acidic electrolyte solution is stable and easy to manage, and therefore, the alumite coating film is generally and widely used. However, the alumite coating film having the porous structure is weak against heat as a surface treatment of a structural member and thus causes cracks due to a difference in thermal expansion coefficient between the aluminum base member and the alumite coating film (Patent Document 1—Japanese Unexamined Patent Application Publication (JP-A) No. H10-130884), thereby causing generation of particles, occurrence of corrosion due to exposure of the aluminum base member, and so on.

Further, a large amount of water and so on is accumulated/adsorbed in holes of the porous structure (Patent Document 2—JP-B-H5-053870), which is released in large quantities as outgas components. This causes many problems such as a significant reduction in performance of a vacuum apparatus, operation failure of devices, occurrence of corrosion of the alumite coating film and the aluminum base member due to coexistence with various gases including a halogen gas and chemicals, and so on. Among halogen gases, particularly a chlorine gas is used as an etching gas in the processing, such as reactive ion etching (RIE), of a metal material and is also used in a cleaning process of a thin film forming apparatus or a dry etching apparatus and, therefore, it is important to achieve a metal surface treatment of an apparatus member that can ensure strong corrosion resistance against the chlorine gas.

In view of this, there are various proposals for alumite coating films with a low increase rate of cracks caused by a high-temperature heat load and their forming methods. For example, there is proposed a method of forming an alumite coating film with a controlled aluminum alloy composition (Patent Document 3—JP-A-H11-181595). However, this alumite coating film also has a porous structure on its surface like the conventional one and various problems due to water remaining in holes of the porous structure remain outstanding.

Various methods are proposed for improving the problems caused by this porous structure. For example, there are proposed a sealing treatment in which an alumite coating film with a porous structure anodized in an acidic electrolyte is immersed in boiling water or treated in pressurized steam, thereby forming aluminum hydroxide (boehmite layer) on its surface to seal holes thereof (Patent Document 4—JP-A-H5-114582), a sealing treatment in a solution containing mainly a hydrate or hydrated oxide of a metal (Patent Document 5—JP-A-2004-060044), and so on. However, water still remains in the holes of the porous structure even after the sealing treatment and the boehmite layer of aluminum hydroxide itself is also a hydrate and thus serves as a water supply source depending on the conditions such as a pressure and a temperature and, therefore, a radical solution has not yet been reached. There is also proposed a method of performing barrier-structure anodic oxidation after forming a porous-structure alumite coating film (Patent Document 6—JP-A-2005-105300). However, since anodic oxidation in two steps is required to be performed, there is a problem that the manufacturing cost increases.

Besides, as a surface treatment when a metal composed mainly of aluminum is used as a structural member, use is made of a thermal spraying method that melts and sprays a powder material of a metal, an alloy, a ceramic, or a combination of the ceramic and the metal or the alloy (Patent Document 7-JP-A-H9-069514). However, in the surface treatment by the thermal spraying method, there remains a problem in that since it is difficult to suppress formation of pores where the film surface and the base member communicate with each other through holes, when a corrosive gas such as a halogen gas is used in an apparatus, the base member is corroded at portions where the metal composed mainly of aluminum is brought into contact with the corrosive gas through the pores.

In order to solve the above problems, the inventors have found that when a metal composed mainly of aluminum is anodized using an anodizing solution with a neutral or nearly neutral pH, an aluminum oxide passivation film being a non-porous amorphous film is obtained such that the water release amount from the aluminum metal oxide film is 1E18 molecules/$cm^2$ or less, and the film is free from occurrence of cracks due to annealing and excellent in resistance against exposure to a chlorine gas (Patent Documents 8 and 9). Further, the inventors have carried out anodic oxidation with respect to high-purity aluminum in which the total content of specific elements (Fe, Cu, Mn, Zn, and Cr) of an aluminum alloy composed mainly of aluminum is suppressed to 1 wt % or less, Mg is added in an amount of 4.5 wt % or less, and Zr is added in an amount of 0.1 wt % and with respect to 99.99% (4N) aluminum in which the content of specific elements is 0.004 wt % and no Mg or Zr is contained, and have found that it is possible to achieve anodization up to a predetermined voltage in a shorter time and the residual current density is small in oxidation at a constant voltage, and thus, it is possible to form excellent barrier-type aluminum oxide films at high throughput. Further, the inventors have found that these high-purity aluminum oxide films are excellent in resistance to a chlorine gas (Patent Document 10).

Patent Document 1: JP-A-H10-130884
Patent Document 2: JP-B-H5-053870
Patent Document 3: JP-A-H11-181595
Patent Document 4: JP-A-H5-114582
Patent Document 5: JP-A-2004-060044
Patent Document 6: JP-A-2005-105300
Patent Document 7: JP-A-H9-069514
Patent Document 8: Japanese Patent Application No. 2005-178562
Patent Document 9: Japanese Patent Application No. 2006-64923
Patent Document 10: PCT International Application No. PCT/JP2006/309327

DISCLOSURE OF THE INVENTION

Problem to be Solved by the Invention

Therefore, if, in a vacuum apparatus such as a semiconductor manufacturing apparatus, use is made of a structural member in which high-purity aluminum or pure aluminum is used as a base member and a nonporous amorphous aluminum oxide passivation film is formed by treating the surface of the base member by anodic oxidation, it is possible to produce the apparatus with a small water release amount and excellent in anneal resistance, resistance to a chlorine gas, and so on.

However, there is a problem that when the high-purity aluminum or the pure aluminum is used as a base member for holding the structure of the apparatus, since the mechanical strength is small, it cannot be used as a structural member of a chamber or the like.

It is an object of this invention to provide a structural member having a high mechanical strength and a nonporous amorphous aluminum oxide passivation film obtained from high-purity aluminum or pure aluminum and a method of manufacturing the structural member.

Means for Solving the Problem

According to the invention, there is obtained a structural member for a manufacturing apparatus, comprising a metal base member composed mainly of aluminum, a high-purity aluminum film formed on a surface of said metal base member, and a nonporous amorphous aluminum oxide passivation film formed by anodizing the high-purity aluminum film.

Preferably, the high-purity aluminum film is aluminum with a purity of 99.99% or more. More preferably, the high-purity aluminum film is aluminum with a purity of 99.999% or more.

The high-purity aluminum film has a thickness of 0.2 μm or more.

The high-purity aluminum film is formed by CVD.

The high-purity aluminum film may be formed by sputtering.

The nonporous amorphous aluminum oxide passivation film is formed by anodizing a surface of said high-purity aluminum film in an anodizing solution of pH 4 to 10. As the anodizing solution, use is preferably made of an anodizing solution with a neutral or nearly neutral pH.

The nonporous amorphous aluminum oxide passivation film exhibits a water release amount of 1E18 molecules/cm$^2$ or less.

The metal base member composed mainly of aluminum contains 50 wt % or more aluminum and further contains 1 to 4.5 wt % magnesium.

Preferably, the metal base member composed mainly of aluminum contains 0.15 wt % or less zirconium.

Preferably, the total content of elements other than aluminum, magnesium, and zirconium is 1 wt % or less in the metal base member composed mainly of aluminum.

More preferably, the content of each of the elements other than aluminum, magnesium, and zirconium is 0.01 wt % or less in the metal base member composed mainly of aluminum.

According to the invention, there is obtained a manufacturing apparatus for an electronic device, using a structural member for a manufacturing apparatus comprising a metal base member composed mainly of aluminum, a high-purity aluminum film formed on a surface of the metal base member, and a nonporous amorphous aluminum oxide passivation film formed by anodizing said high-purity aluminum film.

For the manufacturing apparatus for the electronic device, it is preferable to use the structural member having various features described above with reference to the structural member.

Moreover, in accordance with the invention, there is obtained a method of manufacturing a structural member for a manufacturing apparatus, the method comprising: by forming a high-purity aluminum film on a surface of a metal base member composed mainly of aluminum, and anodizing the high-purity aluminum film in an anodizing solution of pH 4 to 10 containing a nonaqueous solvent having a dielectric constant smaller than that of water and capable of dissolving water, thereby converting at least a surface portion of the high-purity aluminum film into a nonporous amorphous aluminum oxide passivation film.

The high-purity aluminum film is aluminum with a purity of 99.99% or more.

The high-purity aluminum film is formed to a thickness of 0.2 μm or more.

The high-purity aluminum film is formed by CVD or sputtering.

The nonporous amorphous aluminum oxide passivation film is formed to a thickness of 10 nm or more.

Preferably, converting the high-purity aluminum film is converted into the nonporous amorphous aluminum oxide passivation film over substantially the entire thickness of the high-purity aluminum film.

The anodizing solution contains an electrolyte making the anodizing solution electrically conductive and has a pH of 5.5 to 8.5.

Preferably, the anodizing solution contains 50 wt % or less water and has a pH of 6 to 8.

The electrolyte contains at least one kind selected from the group consisting of boric acid, phosphoric acid, organic carboxylic acid, and salts thereof.

The step of anodizing comprises a step of placing the high-purity aluminum film and a predetermined electrode in the anodizing solution, a constant current step of causing a constant current to flow between the high-purity aluminum film and the electrode for a predetermined time, and a constant voltage step of applying a constant voltage between said high-purity aluminum film and the electrode for a predetermined time.

The predetermined time in the constant current step is a time required for a voltage between said high-purity aluminum film and said electrode to reach a predetermined value.

The predetermined time in the constant voltage step is a time required for a current between the high-purity aluminum film and the electrode to reach a predetermined value.

A step of heat-treating the member at a predetermined temperature of 150° C. or more is included after the step of anodizing.

Preferably, heat-treating the member at a predetermined temperature of 300° C. or more is performed after said step of anodizing.

In the constant current step, a current of 0.01 to 100 mA per square centimeter is caused to flow.

Preferably, the current is in the range of 0.1 to 10 mA per square centimeter.

More preferably, the current is 0.15 to 1.5 mA per square centimeter.

In the constant voltage step, a voltage that does not cause electrolysis of the anodizing solution is applied The nonaqueous solvent contains at least one of ethylene glycol, diethylene glycol, triethylene glycol, and tetraethylene glycol.

The electrolyte includes adipate.

The nonporous amorphous aluminum oxide passivation film exhibits a water release an amount of 1E18 molecules/ $cm^2$ or less.

The metal base member composed mainly of aluminum contains 50 wt % or more aluminum and further contains 1 to 4.5% magnesium.

Preferably, the metal base member composed mainly of aluminum contains 0.15 wt % or less zirconium.

Preferably, the total content of elements other than aluminum, magnesium, and zirconium is 1 wt % or less in the metal base member composed mainly of aluminum.

More preferably, the content of each of the elements other than aluminum, magnesium, and zirconium is 0.01 wt % or less in the metal base member composed mainly of aluminum.

Effect of the Invention

According to this invention, an aluminum alloy superior in mechanical strength and lower in cost as compared with high-purity aluminum is used as a base member for holding the structure and a nonporous amorphous aluminum oxide passivation film is formed by surface-treating, by anodic oxidation, a high-purity aluminum film stacked on the surface of the base member, thereby obtaining a structural member. Therefore, it is possible to obtain the structural member having a higher mechanical strength than a structural member in which high-purity aluminum is used as a base member and an aluminum oxide passivation film is formed by directly anodizing the surface of the base member, and further, having properties, that are the same as those exhibited by a high-purity aluminum oxide film, as its surface-treated coating film. Further, it is also excellent in adhesion between the nonporous amorphous aluminum oxide passivation film and the base structural member.

BRIEF DESCRIPTION OF THE DRAWINGS

FIG. 4 is a partial sectional view of a structural member of this invention for use in a semiconductor manufacturing apparatus or the like.

BEST MODE FOR CARRYING OUT THE INVENTION

Before describing an embodiment of this invention, anodic oxidation of high-purity aluminum will be described.

Figure 1:
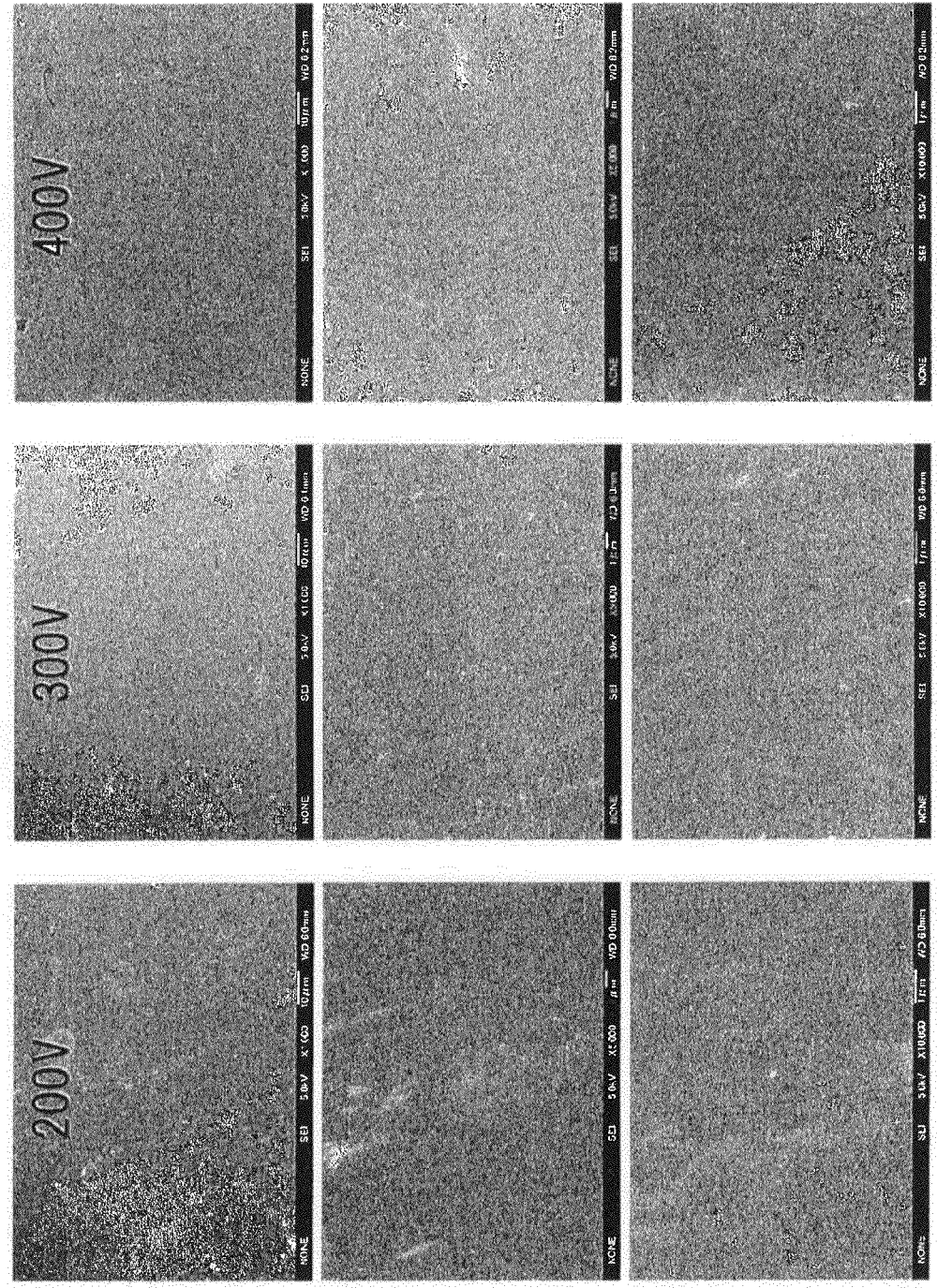
FIG. 1 is photographs for use in explaining this invention, which are scanning microscope photographs of nonporous amorphous aluminum oxide passivation films each obtained by anodizing a 5N high-purity aluminum substrate.

FIG. 1 is scanning microscope photographs of nonporous amorphous aluminum oxide passivation films each obtained by anodizing a 5N (99.999%) high-purity aluminum substrate. The left, middle, and right columns show the films anodized at ultimate voltages of 200V, 300V, and 400V, respectively. In each column, the magnifications are 1,000 times, 5,000 times, and 10,000 times in upper, middle, and lower tiers, respectively. From the figure, the films with flat surfaces are obtained at all ultimate voltages.

Figure 2:
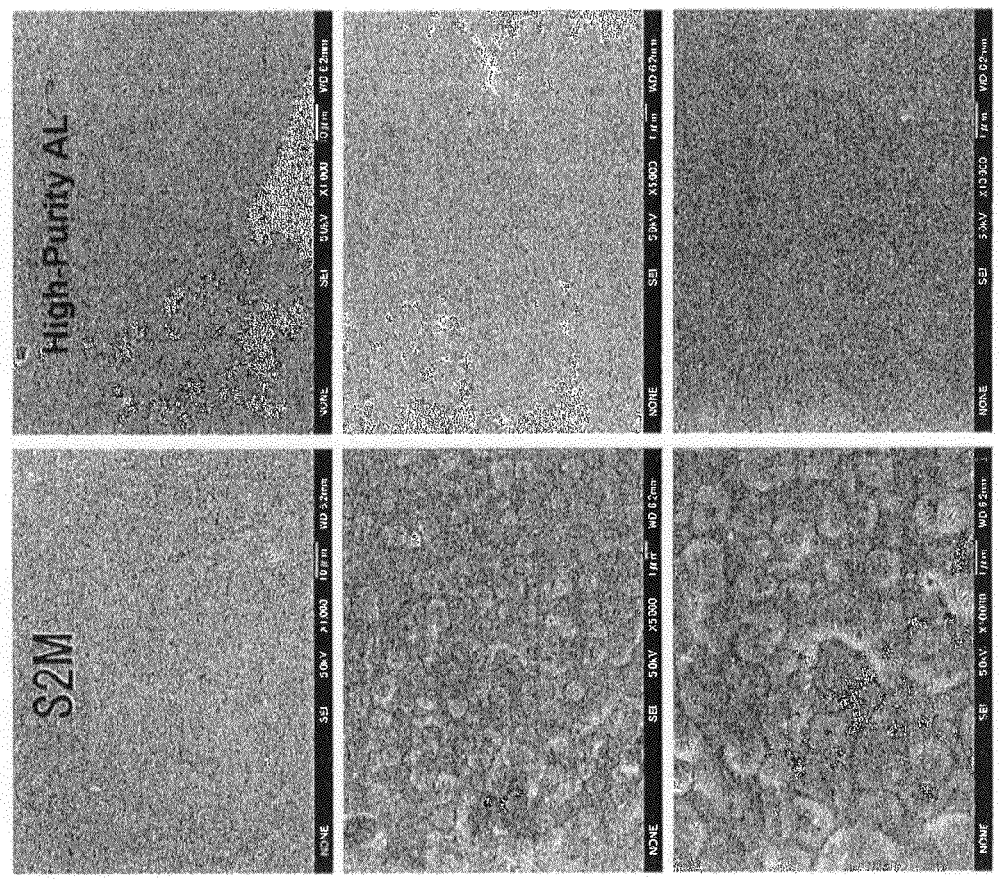
FIG. 2 is photographs for use in explaining this invention, which are microscopic photographs of a nonporous amorphous aluminum oxide passivation film obtained by anodizing a 5N high-purity aluminum substrate and a nonporous amorphous aluminum oxide passivation film obtained using a high-purity aluminum (S2M) substrate containing 2 wt % magnesium (Mg) and 0.1 wt % zirconium (Zr).

FIG. 2 shows, for side-by-side comparison with electron microscope photographs (right side) of a nonporous amorphous aluminum oxide passivation film obtained by anodizing a high-purity aluminum substrate, the surface state of a metal oxide film, on the left side, obtained by anodizing a high-purity aluminum (S2M) substrate containing 2 wt % magnesium (Mg) and 0.1 wt % zirconium (Zr) at the same ultimate anodization voltage of 400V. The magnifications are 1,000 times, 5,000 times, and 10,000 times, respectively. From the figure, it is seen that the surface state of the metal oxide in the case of 5N high-purity Al is superior.

The surface treatment was carried out by placing the substrate in an anodizing solution of pH 7.0 containing ammonium adipate (1 wt %) as a solute and ethylene glycol and water (19 wt %) as a main solvent and then performing anodic oxidation at room temperature.

Figure 3:
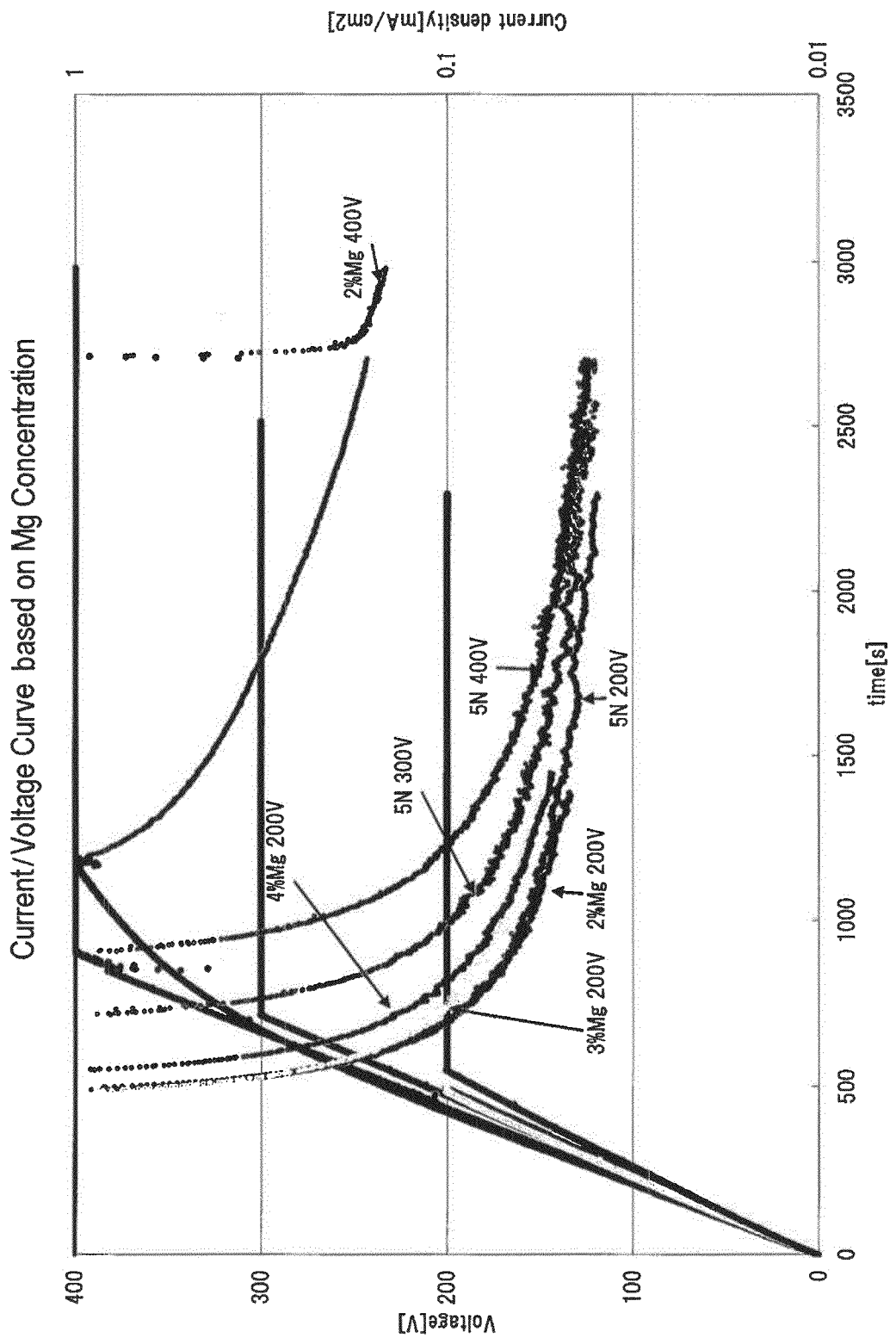
FIG. 3 is a diagram for use in explaining this invention, which is a graph showing elapsed time characteristics of voltage-current when anodizing 5N high-purity aluminum substrates and high-purity aluminum (S2M) substrates containing 2 wt % magnesium (Mg) and 0.1 wt % zirconium (Zr).

The anodic oxidation was carried out by placing the substrate in the anodizing solution and anodizing it until a predetermined ultimate voltage was reached at a constant current with a current density of 1 $mA/cm^2$. Then, after the ultimate voltage is reached, the power was supplied to maintain that voltage for a predetermined time. FIG. 3 shows the characteristics of voltage (left ordinate axis) and current density (right ordinate axis) with respect to the elapsed time in that event. The figure shows the characteristics of anodic oxidation of 5N high-purity aluminum substrates and aluminum substrates containing 2 wt % Mg, and in addition thereto, an aluminum substrate containing 3 wt % Mg and an aluminum substrate containing 4 wt % Mg. The characteristics are such that the anodization was carried out at ultimate voltages of 200V, 300V, and 400V for 5N high-purity aluminum, at ultimate voltages of 400V and 200V for aluminum containing 4 wt % Mg, and at an ultimate voltage of 200V for aluminum containing 3 wt % Mg and aluminum containing 2 wt % Mg. In comparison at the ultimate voltage 400V, in the case of the 5N high-purity aluminum, the linearity of voltage rise in constant-current anodization is excellent, the current density decreases quickly after the ultimate voltage is reached, and further the current density is small. In contrast, in the case of the aluminum containing 4 wt % Mg, the linearity of voltage characteristic is inferior and the current density after the ultimate voltage is reached is large. Therefore, in terms of the manufacturing time of the aluminum oxide film and the film density, the superior film is obtained when anodizing the 5N high-purity aluminum.

It has been confirmed that an aluminum oxide coating film obtained by anodizing a metal composed mainly of aluminum or a metal composed mainly of high-purity aluminum in an anodizing solution of pH 4 to 10, particularly in an anodizing solution of pH 6 to 8, exhibits a water release amount of 1E18 molecules/cm$^2$ or less ($1\times10^{18}$ molecules/cm$^2$ or less), i.e. an extremely small water release amount, and that, in a metal in which aluminum is a main component and the content of specific elements is suppressed, a metal oxide film formed by using a specific anodizing solution has excellent corrosion resistance against a chemical solution such as nitric acid or hydrofluoric acid and a halogen gas, particularly a chlorine gas, because no voids or gas pools are formed and the occurrence of cracks in the oxide film due to heating and so on are suppressed. The aluminum oxide films explained with reference to the above FIGS. 1 to 3 are nonporous amorphous aluminum oxide passivation films that exhibit such properties.

Next, the embodiment of this invention will be described with reference to the drawings.

Figure 4:
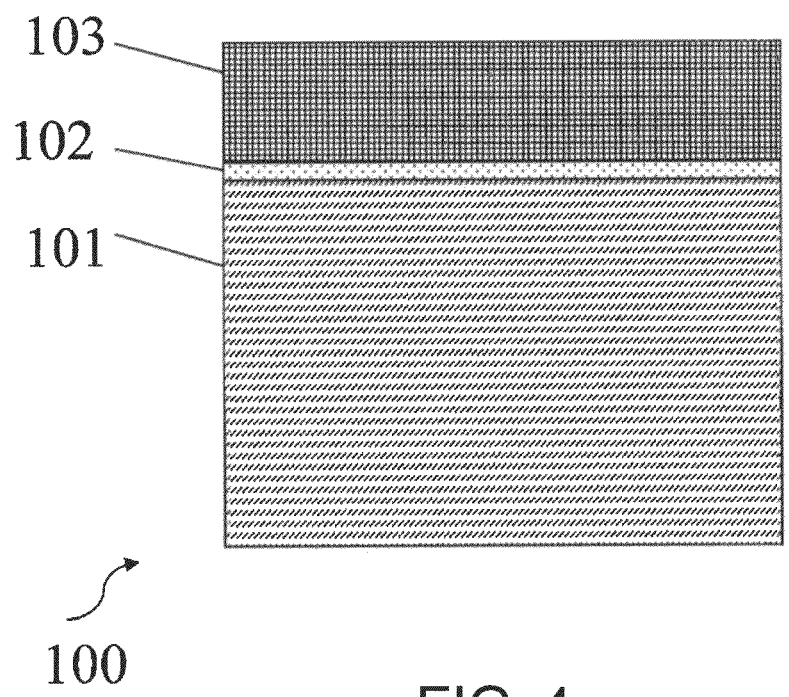

FIG. 4 shows a part of a sectional view of a structural member, for use in a manufacturing apparatus, of Example 1 of this invention.

In the figure, a structural member 100 comprises a substrate 101 being a metal base member composed mainly of aluminum, a high-purity aluminum film 102 formed on the substrate, and a nonporous amorphous aluminum oxide passivation film 103 formed by anodizing at least a surface portion of the high-purity aluminum 102.

As the metal base member composed mainly of aluminum, particularly an alloy called 2017 was used among aluminum alloys containing 50 wt % or more aluminum and further containing 1 to 4.5 wt % magnesium and 0.15 wt % or less zirconium. This aluminum alloy contains, in addition to aluminum, 0.4 to 0.8 wt % Mg, 0.2 wt % Zr, 0.2 to 0.8 wt % Si, 0.7 wt % Fe, 3.5 to 4.5 wt % Cu, 0.4 to 1.0 wt % Mn, 0.1 wt % Cr, 0.25 wt % Zn, 0.15 wt % Ti, and 0.05 wt % of elements other than these elements and aluminum.

On this substrate, a high-purity aluminum film is formed by chemical vapor deposition (CVD). CVD is carried out using methylpyrrolidine alane (abbreviation MPA, chemical formula; $AlH_3:N(CH_3)(CH_2)_4$) as a material gas. This material is a material having alane ($AlH_3$) but no Al—C bond, and thus there is no incorporation of carbon. Alternatively, TIBA, DMAH, DMEAA, or the like may be used as a material gas. By performing CVD using such a material, even if an inner surface (a surface where a passivation film is to be formed, which is a portion to be brought into contact with a corrosive gas or liquid if there is no passivation film) of the base member has a complicated shape with irregularities, it is possible to form a high-purity aluminum film with a uniform thickness. In the case where the shape of the inner surface of the base member is not complicated, a high-purity aluminum film can be formed by sputtering.

In this manner, the film of 99.999% high-purity aluminum is formed. The high-purity aluminum film is formed so as to have a thickness of at least 0.2 μm or more.

Then, the metal base substrate formed with the high-purity aluminum film is anodized in an anodizing solution, thereby performing a treatment of forming a part (surface portion) or the whole of the high-purity aluminum film into a passivation film being an aluminum oxide film. The substrate is placed in the anodizing solution, for example, an anodizing solution of pH 7.0 containing ammonium adipate (1 wt %) as a solute and ethylene glycol and water (20 wt %) as a main solvent, and then anodized at 23° C. In this manner, the manufactured oxide film of the high-purity aluminum film serves as a passivation film that does not release water. By forming the part or the whole of the pure aluminum into the aluminum oxide film as described above, it is possible to obtain a structural member in which the aluminum alloy base member having a high mechanical strength is formed with the high-purity aluminum oxide film.

Figure 5:
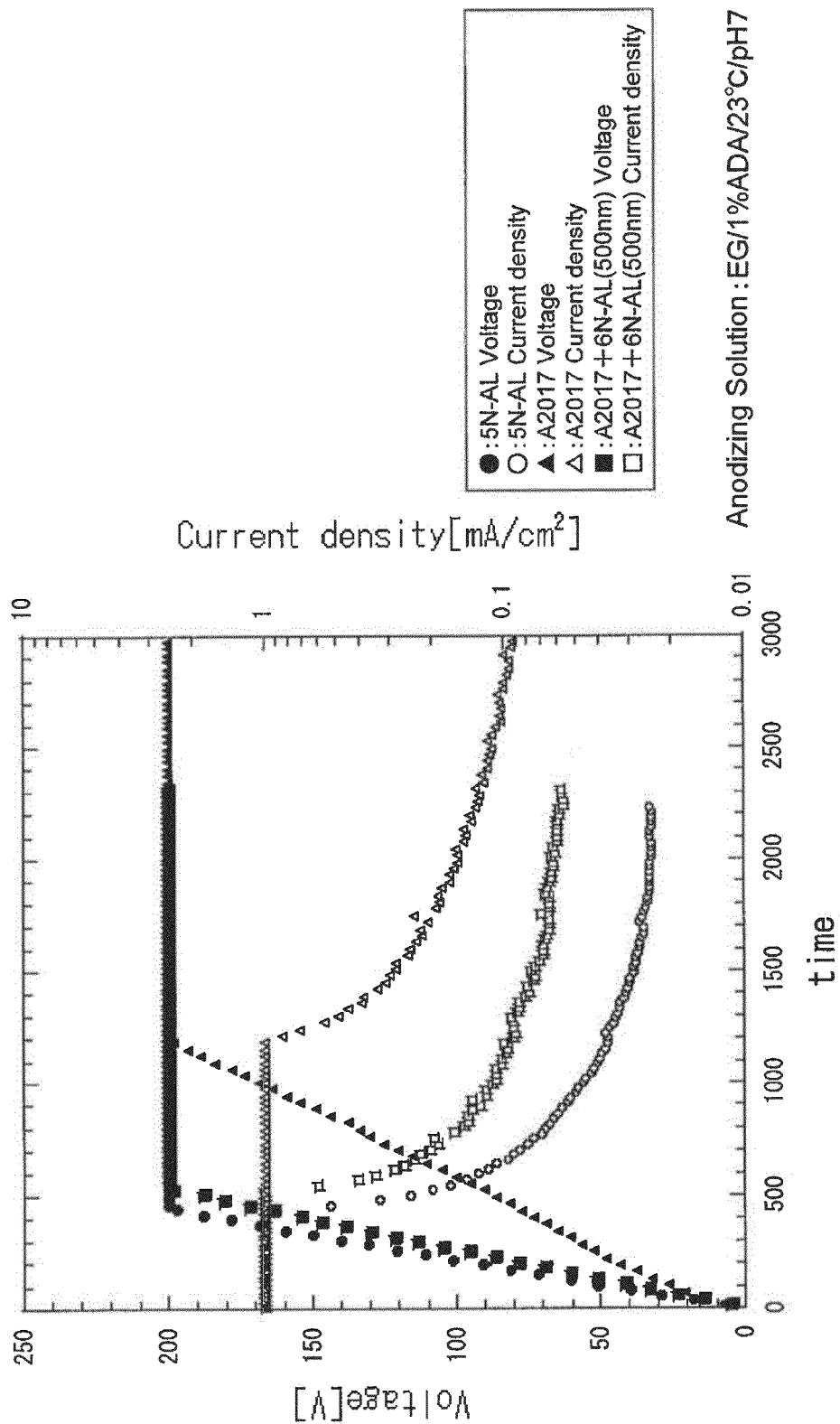
FIG. 5 shows an example of voltage and current characteristics during anodic oxidation in an Example of this invention.

In another Example, an A2017 aluminum alloy was used as a metal base member and 99.9999% aluminum (6N aluminum), as high-purity aluminum instead of the 5N aluminum, was formed to a thickness of 500 nm. Then, the high-purity aluminum film was anodized in the same anodizing solution as that in Example 1. FIG. 5 shows the voltage and current characteristics with respect to the elapsed time in that event. The figure also shows the voltage and current characteristics when an A2017 aluminum alloy substrate itself and a 5N aluminum substrate itself were anodized. From these characteristics, the properties when the film of the 6N aluminum was formed on the aluminum alloy are inferior to those when the 5N aluminum was used as a structural member itself, but are superior to those of a passivation film obtained by anodizing the A2017 aluminum alloy substrate itself.

Figure 6:
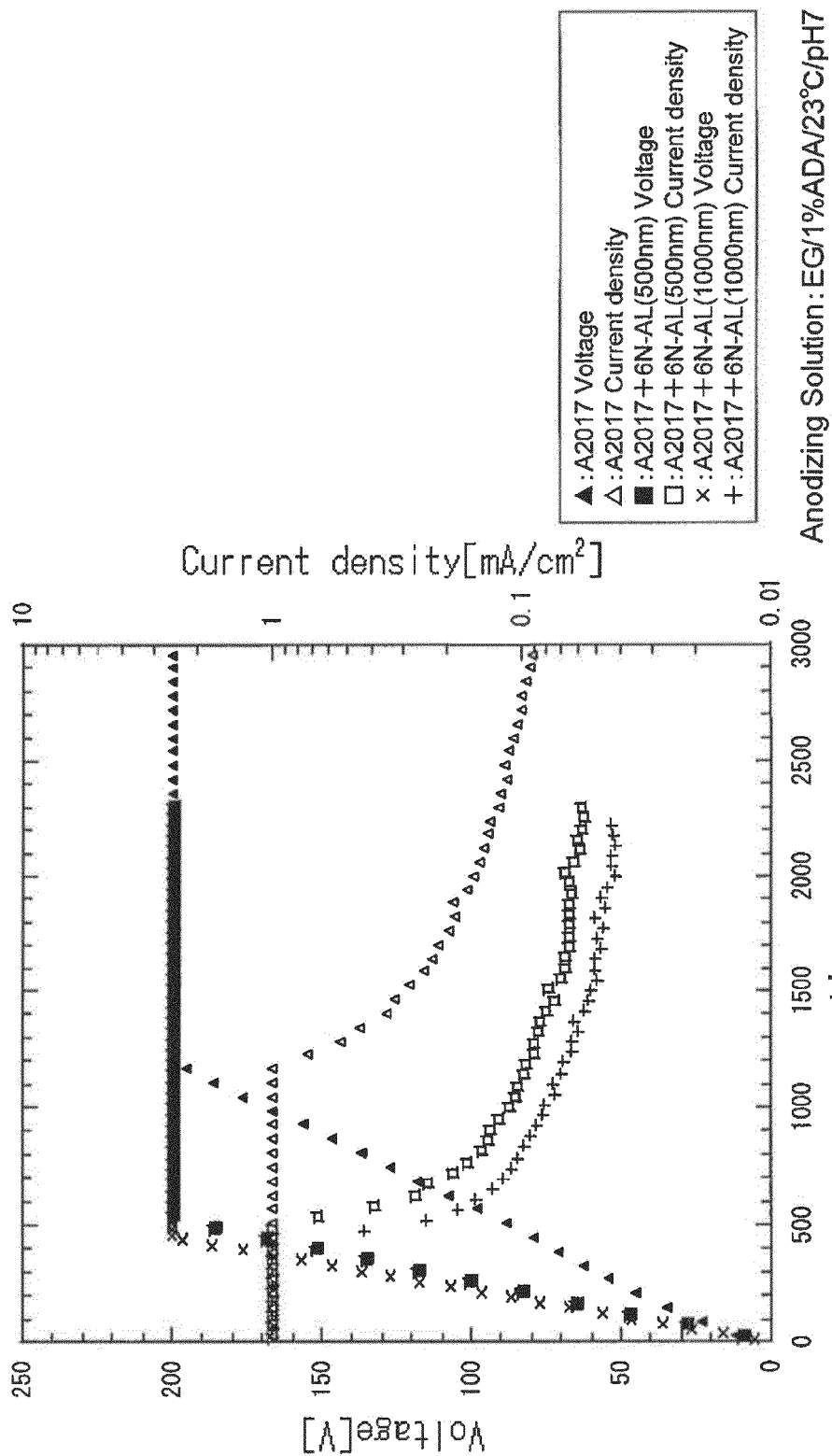
FIG. 6 shows another example of voltage and current characteristics during anodic oxidation in an Example of this invention.

FIG. 6 shows the anodic oxidation characteristics when 6N aluminum was formed to a thickness of 1000 nm on a metal base member of an A2017 aluminum alloy. For comparison, the figure also shows part of the data shown in FIG. 5. It is superior in voltage rise characteristic and residual current density when the 6N aluminum film is 1000 nm rather than 500 nm.

The main solvent may be, instead of ethylene glycol, diethylene glycol, triethylene glycol, or the like. The pH is preferably in the range of 6 to 8.

Further, a 4N high-purity aluminum film may alternatively be used.

INDUSTRIAL APPLICABILITY

As described above, according to this invention, it is possible to provide an aluminum alloy member having a high-purity aluminum oxide passivation film and a method of manufacturing the same. Such a metal member exhibits excellent corrosion resistance against chemicals and halogen gases, particularly a chlorine gas, and further, cracks hardly occur in the metal oxide film even if heated. Therefore, it is possible to suppress generation of particles and corrosion due to exposure of the aluminum base body, the thermal stability is high, and the amount of outgas released from the film is small. If it is used as a protective film of a structural member such as an inner wall of a vacuum apparatus such as a vacuum thin-film forming apparatus, the ultimate vacuum of the apparatus is improved and the quality of thin films manufactured is improved, thus leading to reduction in operation failure of devices having the thin films.

Further, according to a metal oxide film manufacturing method of this invention, it is possible to efficiently form a pore-free metal oxide film with a high withstand voltage in which cracks hardly occur during heating. This metal oxide film is suitable as a protective coating film for the surface of a metal base member and can also be used as an impurity shielding coating film or an anticorrosive coating film, and thus, the application range is wide.

The invention claimed is:

1. A structural member comprising:
   a metal base member comprising aluminum,
   an aluminum film having a purity of 99.99 wt % or more, the film formed to a thickness of 0.2 μm to 1.0 μm on a surface of the metal base member by CVD or sputtering, and
   a nonporous amorphous aluminum oxide passivation film formed by anodizing the aluminum film,
   wherein the nonporous amorphous aluminum oxide passivation film is formed by anodizing a surface of the aluminum film in an anodizing solution of pH 4 to 10 which comprises a nonaqueous solvent that dissolves water and that has a dielectric constant less than a dielectric constant of water.

2. The structural member of claim 1, wherein the nonporous amorphous aluminum oxide passivation film exhibits a water release amount of 1E18 molecules/cm$^2$ or less.

3. The structural member of claim 1, wherein the metal base member comprises 50 wt % or more of aluminum and 1 to 4.5 wt % of magnesium.

4. The structural member of claim 3, wherein the metal base member comprises 0.15 wt % or less of zirconium.

5. The structural member of claim 3, wherein a total content of elements other than aluminum, magnesium, and zirconium is 1 wt % or less in the metal base member.

6. The structural member of claim 5, wherein a content of each of the elements other than aluminum, magnesium, and zirconium is 0.01 wt % or less in the metal base member.

7. The structural member of claim 1, wherein the nonaqueous solvent comprises at least one solvent selected from the group consisting of ethylene glycol, diethylene glycol, triethylene glycol, and tetraethylene glycol.

8. A manufacturing apparatus for an electronic device, comprising the structural member of claim 1.

* * * * *